United States Patent
Ham et al.

(10) Patent No.: US 9,205,529 B2
(45) Date of Patent: Dec. 8, 2015

(54) DISPENSER FOR CHEMICAL-MECHANICAL POLISHING (CMP) APPARATUS, CMP APPARATUS HAVING THE DISPENSER, AND CMP PROCESS USING THE CMP APPARATUS

(75) Inventors: Liang-Chuo Ham, Hsinchu (TW); Chin-Chuan Chih, Miaoli County (TW); Jiann-Mo Lee, Hsinchu (TW); Chia-Ming Yang, New Taipei (TW); Wen-Yen Chen, Miaoli County (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 455 days.

(21) Appl. No.: 13/165,763

(22) Filed: Jun. 21, 2011

(65) Prior Publication Data

US 2012/0329278 A1    Dec. 27, 2012

(51) Int. Cl.
| | |
|---|---|
| *H01L 21/306* | (2006.01) |
| *B24B 57/00* | (2006.01) |
| *B24B 57/02* | (2006.01) |
| *H01L 21/321* | (2006.01) |
| *H01L 21/67* | (2006.01) |
| *B24B 3/02* | (2006.01) |

(52) U.S. Cl.
CPC . *B24B 57/02* (2013.01); *B24B 3/02* (2013.01); *H01L 21/3212* (2013.01); *H01L 21/32115* (2013.01); *H01L 21/6708* (2013.01); *H01L 21/67051* (2013.01)

(58) Field of Classification Search
USPC ........... 156/345.12, 345.13, 345.21; 451/446; 257/E21.23
See application file for complete search history.

(56) References Cited

U.S. PATENT DOCUMENTS

| | | | | |
|---|---|---|---|---|
| 3,744,187 | A * | 7/1973 | Lynah et al. | 451/269 |
| 6,284,092 | B1 * | 9/2001 | Manfredi | 156/345.12 |
| 6,319,098 | B1 * | 11/2001 | Osterheld et al. | 451/54 |
| 7,052,374 | B1 * | 5/2006 | Lu et al. | 451/60 |
| 2003/0143933 | A1 | 7/2003 | Baek et al. | |

* cited by examiner

*Primary Examiner* — Sylvia R MacArthur
(74) *Attorney, Agent, or Firm* — Winston Hsu; Scott Margo

(57) ABSTRACT

A dispenser for a chemical-mechanical polishing (CMP) apparatus, includes a delivery arm disposed over a polishing pad of a CMP apparatus, at least a slurry delivery groove formed in the delivery arm and extending along a length of the delivery arm, and a plurality of first openings connected to the slurry delivery groove.

8 Claims, 3 Drawing Sheets

DISPENSER FOR CHEMICAL-MECHANICAL POLISHING (CMP) APPARATUS, CMP APPARATUS HAVING THE DISPENSER, AND CMP PROCESS USING THE CMP APPARATUS

BACKGROUND OF THE INVENTION

1. Field of the Invention

The present invention generally relates to a dispenser for a chemical-mechanical polishing (hereinafter abbreviated as CMP) apparatus, a CMP apparatus having the dispenser, and a CMP process using the CMP apparatus, and more particularly, to a slurry and rinse dispenser for a CMP apparatus, a CMP apparatus having the dispenser, and a CMP process using the CMP apparatus.

2. Description of the Prior Art

Integrated circuits (ICs) are typically formed on substrates, exemplarily silicon wafers, by sequential deposition of conductive, semi-conductive or insulating layers. After depositing the required layer, etching process is often performed to create circuitry features and followed by another film formation. Consequently, the topmost surface of the substrate may become non-planar across its surface and requires planarization.

CMP is one accepted method of planarization and now typically employed in the industry. In general, CMP involves pressing a surface of the substrate against a polishing pad that is mounted upon a circular turning platen with a polishing head tightly holds the substrate. Slurries, usually either are basic or acidic and generally contain particles, are delivered to the center of the polishing pad to chemically passivate or oxidize the surface being polished and abrasively remove or polish off the surface of the substrate. The interaction of the polishing pad and the slurries with the surface being polished results in controlled polishing of the desired surface for subsequent processes.

Please refer to FIG. 1, which is a graph depicting removal rates versus distance from a wafer center to wafer edges using a conventional CMP apparatus. One problem is encountered in the CMP process using the conventional CMP apparatus when the slurry is delivered to the center of the polishing pad. In detail, because the slurry is delivered to only the center of the polishing pad in the conventional CMP apparatus, the slurry is not uniformly distributed. Accordingly, both general decrease in removal rate and lack of uniformity in removal rate on different regions of the polishing pad are caused. As shown in FIG. 1, the removal rate at the wafer center is significantly higher than the removal rate near the wafer edges. Accordingly, significant and costly reduction in CMP process efficiency and product quality are resulted.

SUMMARY OF THE INVENTION

According to a first aspect of the present invention, a dispenser for a CMP apparatus is provided. The dispenser includes a delivery arm, at least a slurry delivery groove formed in the delivery arm and extending along a length of the delivery arm, and a plurality of first openings connected to the slurry delivery groove.

According to a second aspect of the present invention, a CMP apparatus is provided. The CMP apparatus includes a rotatable platen having an upper surface, a polishing pad mounted on the upper surface of the rotatable platen, and a delivery arm disposed over the polishing pad. More important, the dispenser further includes a delivery arm, at least a slurry delivery groove formed in the delivery arm and extending along a length of the delivery arm, and a plurality of first openings connected to the slurry delivery groove.

According to a third aspect of the present invention, a CMP process is provided. The CMP process includes providing a wafer having a to-be-polished surface to a CMP apparatus, and performing a CMP process to polish the to-be-polished surface of the wafer. The provided CMP apparatus includes a polishing pad, a polishing head holding the wafer with the to-be-polished surface facing the polishing pad, and a dispenser disposed over the polishing pad. It is noteworthy that the dispenser further includes a delivery arm, at least a slurry delivery groove formed in the delivery arm and extending along a length of the delivery arm, and a plurality of first openings connected to the slurry delivery groove.

According to the dispenser for a CMP apparatus, the CMP apparatus having the dispenser, and the CMP process using the CMP apparatus provided by the present invention, the first openings connected to the slurry delivery grooves uniformly distribute the slurry to the polishing pad. Therefore removal rates on different regions of the polishing pad are averaged while the removal rates are all improved. Accordingly, surface planarity of the wafer being polished and the process efficiency of CMP adopting the provided CMP apparatus are both improved.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
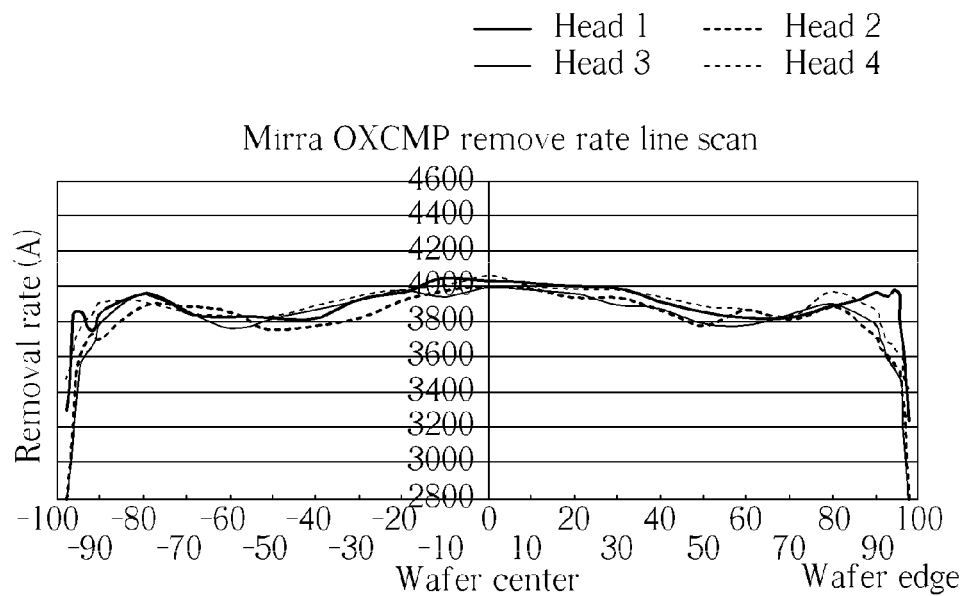
FIG. 1 is a graph depicting removal rates versus distance from a wafer center to wafer edges using a conventional CMP apparatus.
Figure 2:
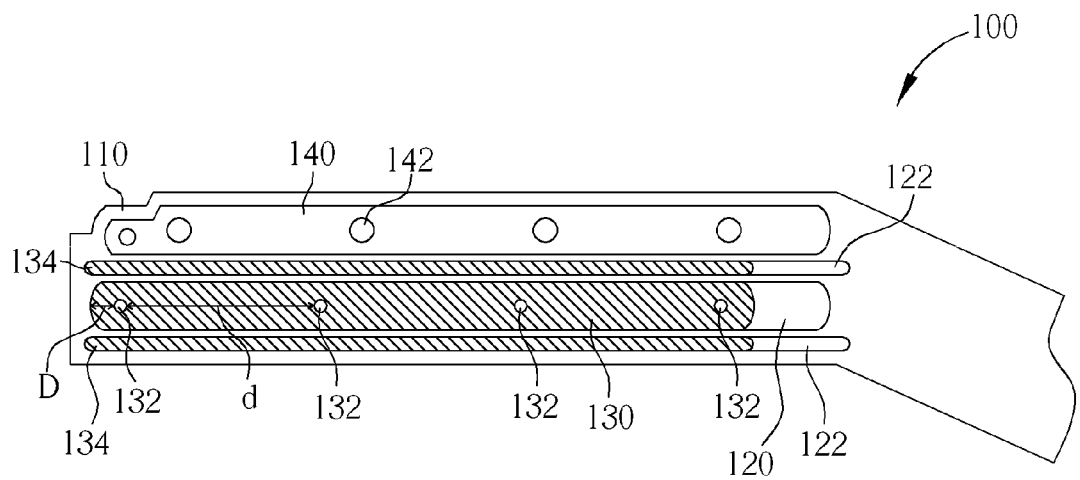
FIG. 2 is schematic drawing illustrating a dispenser for a CMP apparatus provided by a preferred embodiment of the present invention.

Please refer to FIG. 2, which is schematic drawing illustrating a dispenser for a CMP apparatus provided by a preferred embodiment of the present invention. As shown in FIG. 2, the preferred embodiment provides a dispenser 100 for a CMP apparatus. The dispenser 100 serves to provide slurry and cleaning fluid used in CMP process, and the slurry, usually either is basic or acidic, exemplarily includes a reagent, frictional particles, and chemical reaction catalyst. The dispenser 100 includes a delivery arm 110, at least a slurry delivery groove 120 formed in the delivery arm 110 and extending along a length of the delivery arm 110, and a plurality of first openings 132 connected to the slurry delivery groove 120. In this preferred embodiment, an amount of the first openings 132 is exemplarily four, but not limited to this. It should be appreciated that the amount of the first openings 132 can be increased or reduced to fit the needs of different applications. It is noteworthy that the first openings 132 are formed in a component 130 that is tightly clipped to the slurry delivery groove 120. And spacing distances "d" between the first openings 132 are the same. As shown in FIG. 2, the delivery arm 110 further includes a pair of mortises 122 and the component 130 includes a pair of tenons 134 corresponding to the mortises 122. The component 130 is tightly clipped or combined to the slurry delivery groove 120 by jointing the mortises 122 of the delivery arm 110 and the tenons 134 of the component 130. Furthermore, a distance "D" between an end of the slurry delivery groove 120 and the first opening 132 proximal to the end is adjustable by gliding the component 130.

Please still refer to FIG. 2. The dispenser 100 further includes a cleaning fluid delivery groove 140 formed in the delivery arm 110. The cleaning fluid delivery groove 140 serves to provide cleaning fluid such as de-ionized (DI) water for cleaning a polishing pad. The dispenser 100 includes at least a second opening 142, however preferably a plurality of second openings 142 as shown in FIG. 2, connected to the cleaning fluid delivery groove 140. The second openings 142 are preferably mounted with spray nozzles (not shown) respectively for providing high-pressured DI water.

Figure 3:
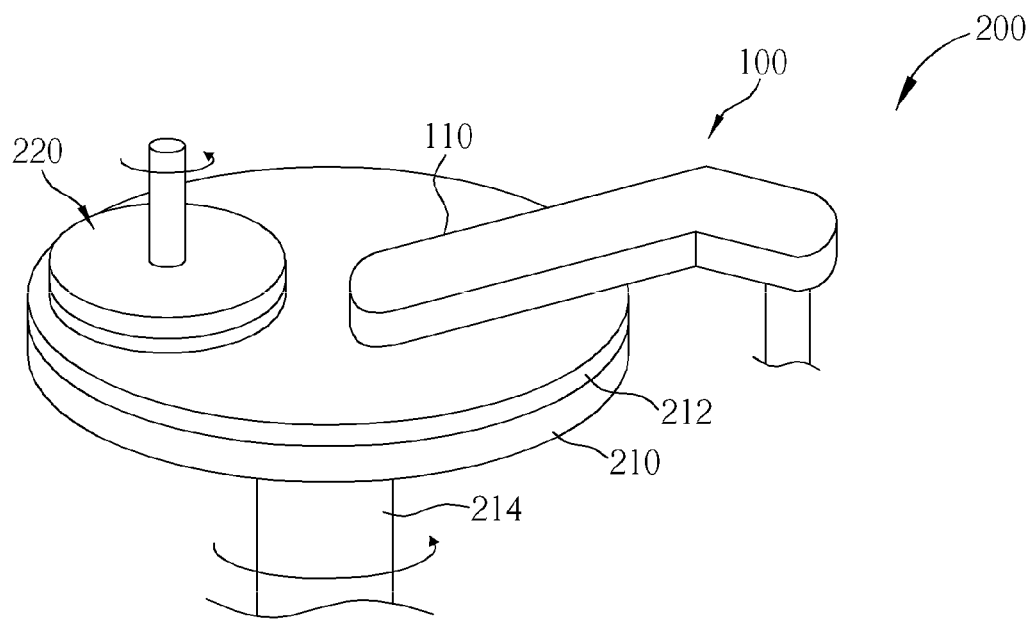
FIG. 3 is a perspective schematic drawing of a CMP apparatus provided by a preferred embodiment of the present invention.
Figure 4:
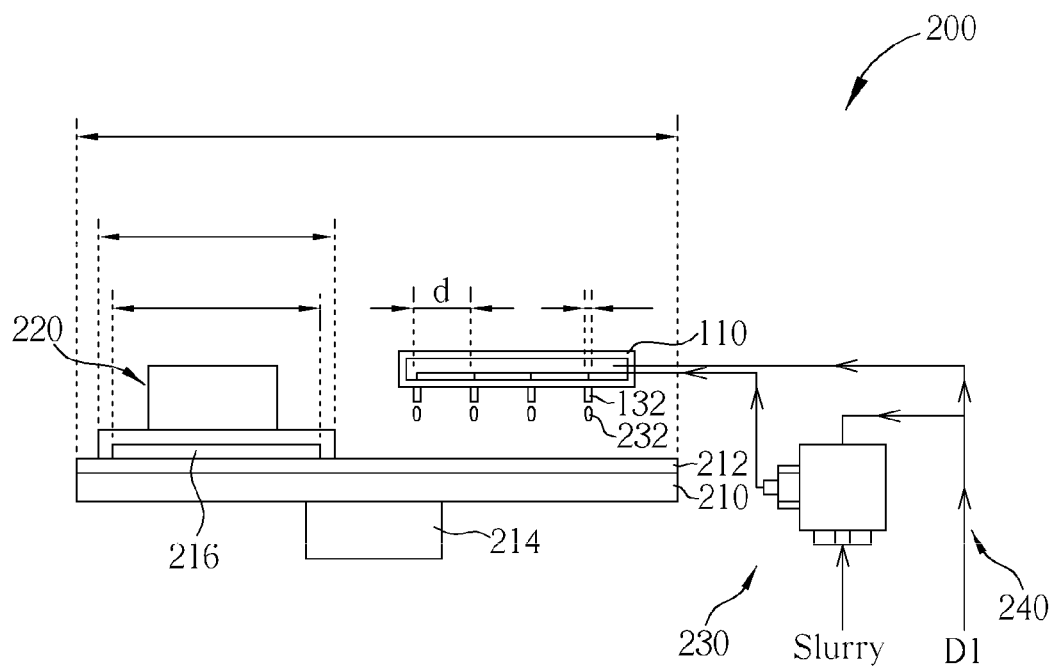
FIG. 4 is a partial cross-sectional view of the CMP apparatus.

Please refer to FIG. 3 and FIG. 4, FIG. 3 is a perspective schematic drawing of a CMP apparatus provided by a preferred embodiment of the present invention and FIG. 4 is a partial cross-sectional view of the CMP apparatus. In order to clearly describe the structure of the present invention, FIG. 3 and FIG. 4 should be referred together. According to the preferred embodiment, a CMP apparatus 200 is provided. The CMP apparatus 200 includes a rotatable platen 210. The rotatable platen 210 has an upper surface on which a polishing pad 212 is mounted. The rotatable platen 210 is rotated by a shaft 214 in a direction indicated by an arrow shown in FIG. 3 by any suitable motor or driving means (not shown). The polishing pad 212 is exemplarily polyurethane foam having rough surface and is exemplarily about 20 inches in diameter, but not limited to this.

The CMP apparatus 200 also includes at least a polishing head 220 located over the polishing pad 212. When performing a CMP process using the CMP apparatus 200, the polishing head 220 holds a wafer 216 having a to-be-polished face faced down to the polishing pad 212 and applies a controllable pressure so as to push the wafer 216 against the polishing pad 212. For an 8-inch wafer, the polishing head 220 is exemplarily about 9.8 inches in diameter; however those skilled in the art would easily realize that the size of the polishing head 220 can be changed when wafers are shifted from 8 inches to 12 inches.

Please still refer to FIG. 3 and FIG. 4. According to the preferred embodiment, the dispenser 100 is disposed over the polishing pad 212 with the delivery arm 110 extending to a center of the polishing pad 212.

Accordingly, the delivery arm 110 provided by the preferred embodiment has a length exemplarily of 8.5 inches, and the distance "d" between each first opening 132 is exemplarily 2.1 inches. However, those skilled in the art would easily realize that the length and the distance "d" provided by the preferred embodiment are not limited to this. Furthermore, the length of the delivery arm 110 is larger than the diameter of the wafer 216 being polished but smaller than a half of the diameter of the polishing pad 212. Additionally, and opening width of the first openings 132 is exemplarily 0.06 inch, however the opening width can be adjusted as long as the slurry can be fluently dispensed. For example, the opening width of the first openings 132 can be gradually larger and larger from the center of the polishing pad 212 to the edge of the polishing pad 212 for further improving the uniformity of the CMP result.

Please refer to FIG. 4 again. The CMP apparatus 200 provided by the preferred embodiment further includes a slurry feeding system 230 connected to the delivery arm 100 to provide a slurry 232 into the slurry delivery groove 120 (shown in FIG. 2) so that the slurry 232 is dispensed to the polishing pad 212 by the first openings 132. Furthermore, the CMP apparatus 200 includes a cleaning fluid feeding system 240 connected to the delivery arm 100 to provide a cleaning fluid (not shown) into the cleaning fluid delivery groove 140 (shown in FIG. 2). It is found that the slurry 232 often solidifies at the first openings 132 and thus obstructs the slurry distribution and causes a contamination issue. To solve this problem, the cleaning fluid feeding system 240 is further connected to the slurry feeding system 230 to provide the cleaning fluid into the slurry delivery groove 120 and the first openings 132 in the preferred embodiment. Accordingly, the cleaning fluid is provided to the slurry feeding system 230 after a few runs of CMP and to wash the solidified slurry out of the slurry delivery groove 120 and the first openings 132. Therefore, the obstruction and contamination issues are eliminated by the preferred embodiment.

Figure 5:
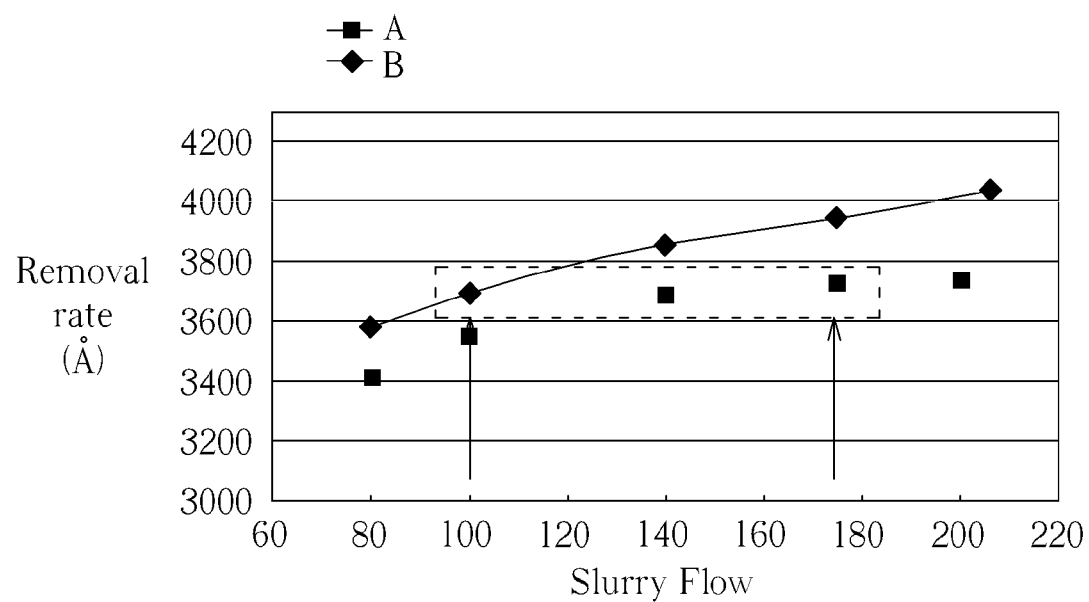
FIG. 5 is a coordinate graph illustrating a relationship between the slurry flow rate and the removal rate.

More important, since the delivery arm 110 extends to the center of the polishing pad 212 and the first openings 132 for providing the slurry 232 to the polishing pad 212 are evenly formed along the delivery arm 110 as shown in FIG. 4, the slurry 232 is uniformly distributed to the polishing pad 212 by the four first openings 132. After providing the wafer 216 to the CMP apparatus 200, the preferred embodiment is to perform a CMP process to the wafer 216. Please refer to FIG. 5, which is a coordinate graph illustrating a relationship between the slurry flow rate and the removal rate with abscissa depicting the slurry flow rate and the ordinate depicting the removal rate. It is noteworthy that in FIG. 5, Lines A depict the removal rate obtained by a conventional CMP apparatus while Lines B depict the removal rate obtained by the CMP apparatus 200 provided by the preferred embodiment. According to FIG. 5, it is found that the removal rate of the CMP apparatus 200 of the preferred embodiment is significantly improved at the slurry flow rate the same with which the conventional CMP apparatus is provided. That is to say, with the same slurry usage, the removal rate is improved by the CMP apparatus 200 provided by the preferred embodiment. In other words, the slurry usage and the process cost are reduced by the CMP apparatus 200 provided by the preferred embodiment even at the removal rate the same with the conventional CMP apparatus.

Figure 6:
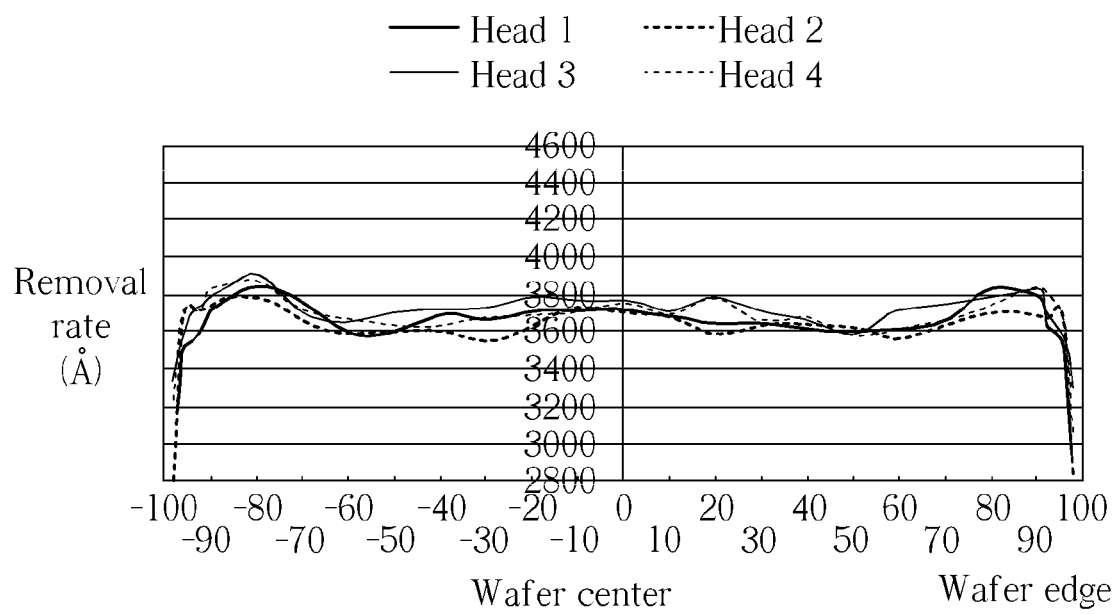
FIG. 6 is a graph depicting removal rates versus distance from a wafer center to wafer edges using the CMP apparatus 200 of the preferred embodiment.

Please refer to FIG. 6, which is a graph depicting removal rates versus distance from a wafer center to wafer edges using the CMP apparatus 200 of the preferred embodiment. As shown in FIG. 6, it is found that the removal rates are averaged from the wafer center to the wafer edges of the polished wafer 216. Accordingly, the CMP apparatus 200 provided by the preferred embodiment not only improves the removal rate, but also improves the uniformity after performing a CMP process. Additionally, by gliding the component 130 in the slurry delivery groove 120, the first openings 132 above the polishing pad 212 can be adjusted from the center of the polishing pad 212 to regions near the center of the polishing pad 212, thus to further change the removal rates if required.

According to the dispenser for a CMP apparatus, the CMP apparatus having the dispenser, and the CMP process using the CMP apparatus provided by the present invention, the first openings connected to the slurry delivery grooves uniformly distribute the slurry to the polishing pad. Therefore removal rates on different regions of the polishing pad are averaged while the removal rates are all improved. Accordingly, surface planarity of the wafer being polished and the process efficiency of CMP adopting the provided CMP apparatus are both improved.

Those skilled in the art will readily observe that numerous modifications and alterations of the device and method may be made while retaining the teachings of the invention.

What is claimed is:

1. A CMP apparatus comprising:
   a rotatable platen having an upper surface;
   a polishing pad mounted on the upper surface of the rotatable platen; and
   a dispenser disposed over the polishing pad, wherein the dispenser further comprises:
   a delivery arm;
   at least a slurry delivery groove formed in the delivery arm and extending along a length of the delivery arm, a slurry being directly provided into the slurry delivery groove such that the slurry delivery groove directly contacting the slurry;
   a component clipped to the slurry delivery groove;
   a plurality of first openings formed in the component and connected to the slurry delivery groove, wherein a distance between an end of the slurry delivery groove and a first opening proximal to the end is adjustable by gliding the component in a direction parallel to the first openings of the component; and
   a cleaning fluid delivery groove formed in the delivery arm;
   wherein a cleaning fluid source is connected to the cleaning fluid delivery groove, a slurry source is connected to the slurry delivery groove, in which the slurry is transported through the slurry delivery groove and a cleaning fluid is transported through the cleaning fluid delivery groove simultaneously without mixing.

2. The CMP apparatus according to claim 1, wherein spacing distances between the first openings are the same.

3. The CMP apparatus according to claim 1, further comprising at least a second opening connected to the cleaning fluid delivery groove.

4. The CMP apparatus according to claim 1, wherein the delivery arm is extended to a center of the polishing pad.

5. The CMP apparatus according to claim 1, further comprising a slurry feeding system connected to the delivery arm to provide the slurry into the slurry delivery groove.

6. The CMP apparatus according to claim 5, further comprising a cleaning fluid feeding system connected to the delivery arm to provide the cleaning fluid into the cleaning fluid delivery groove.

7. The CMP apparatus according to claim 6, wherein the cleaning fluid feeding system is further connected to the slurry feeding system to provide the cleaning fluid into the slurry delivery groove.

8. The CMP apparatus according to claim 1, further comprising at least a polishing head located over the polishing pad.

* * * * *